United States Patent
Okawa et al.

(10) Patent No.: US 9,978,856 B2
(45) Date of Patent: May 22, 2018

(54) BIPOLAR TRANSISTOR

(71) Applicant: TOYOTA JIDOSHA KABUSHIKI KAISHA, Toyota-shi, Aichi-ken (JP)

(72) Inventors: Takashi Okawa, Nisshin (JP); Hiroomi Eguchi, Seto (JP); Hiromichi Kinpara, Seto (JP); Satoshi Ikeda, Toyota (JP)

(73) Assignee: TOYOTA JIDOSHA KABUSHIKI KAISHA, Tokyo (JP)

( * ) Notice: Subject to any disclaimer, the term of this patent is extended or adjusted under 35 U.S.C. 154(b) by 34 days.

(21) Appl. No.: 15/025,391

(22) PCT Filed: Aug. 27, 2014

(86) PCT No.: PCT/JP2014/072480
§ 371 (c)(1),
(2) Date: Mar. 28, 2016

(87) PCT Pub. No.: WO2015/060006
PCT Pub. Date: Apr. 30, 2015

(65) Prior Publication Data
US 2016/0240634 A1    Aug. 18, 2016

(30) Foreign Application Priority Data
Oct. 21, 2013   (JP) ................................. 2013-218238

(51) Int. Cl.
*H01L 29/66*   (2006.01)
*H01L 29/735*  (2006.01)
(Continued)

(52) U.S. Cl.
CPC ........ *H01L 29/735* (2013.01); *H01L 29/0623* (2013.01); *H01L 29/0808* (2013.01);
(Continued)

(58) Field of Classification Search
CPC ... H01L 29/73; H01L 29/7322; H01L 29/735; H01L 29/0623; H01L 29/1008
See application file for complete search history.

(56) References Cited

U.S. PATENT DOCUMENTS 7,755,168 B2 *  7/2010  Terashima .......... H01L 29/0692
                                              257/565
8,847,358 B2 *  9/2014  Lin .................... H01L 29/6625
                                              257/560
(Continued)

FOREIGN PATENT DOCUMENTS

JP    H05-21442 A     1/1993
JP    2014-103193 A   6/2014

OTHER PUBLICATIONS

Nov. 17, 2017 Office Action Issued in U.S Appl. No. 15/025,315.
(Continued)

*Primary Examiner* — Joseph C Nicely
*Assistant Examiner* — Tuan A Hoang
(74) *Attorney, Agent, or Firm* — Oliff PLC

(57) ABSTRACT

Presented is a bipolar transistor capable of improving a current amplification rate while improving voltage resistance. A bipolar transistor is provided with a p-type emitter region, a p-type collector region, an n-type base region located between the emitter region and the collector region, a p-type first embedded region located below the base region, and an n-type region having a lower n-type impurity concentration than the base region. The base region is provided with a first high-concentration region and a low-concentration region positioned above the first embedded region, and a second high-concentration region positioned on a collector region side than the low-concentration region, wherein the second high-concentration region has a higher n-type impurity concentration than the low-concentration region.

6 Claims, 10 Drawing Sheets

(51) Int. Cl.
  *H01L 29/06*  (2006.01)
  *H01L 29/10*  (2006.01)
  *H01L 29/73*  (2006.01)
  *H01L 29/732* (2006.01)
  *H01L 29/08*  (2006.01)

(52) U.S. Cl.
  CPC ...... *H01L 29/0821* (2013.01); *H01L 29/1008* (2013.01); *H01L 29/73* (2013.01); *H01L 29/732* (2013.01)

(56) References Cited

U.S. PATENT DOCUMENTS

| | | | |
|---|---|---|---|
| 2012/0098096 A1* | 4/2012 | Lin | H01L 29/6625 257/565 |
| 2015/0097265 A1* | 4/2015 | Lin | H01L 29/735 257/526 |
| 2016/0233323 A1 | 8/2016 | Okawa et al. | |

OTHER PUBLICATIONS

U.S. Appl. No. 15/025,315, filed Mar. 28, 2016 in the name of Okawa et al.

Feb. 22, 2018 Notice of Allowance issued in U.S. Appl. No. 15/025,315.

* cited by examiner

BIPOLAR TRANSISTOR

CROSS REFERENCE TO RELATED APPLICATION

The present application is a related application of Japanese Patent Application No. 2013-218238 filed on Oct. 21, 2013, and claims priority to this Japanese Patent Application, the entire contents of which are hereby incorporated by reference into the present application.

TECHNICAL FIELD

The technique disclosed in this description relates to a bipolar transistor.

BACKGROUND ART

For example, Japanese Patent Application Publication No. H5-21442 (hereafter referred to as Patent Document 1) discloses a lateral pnp transistor. In this pnp transistor, a $p^+$ type second collector region is provided under a collector region. Due to this, a moving distance of carriers (holes) is shortened, and a current amplification rate is improved.

SUMMARY OF INVENTION

Technical Problem

A bipolar transistor with a structure that arranges a base region between a collector region and an emitter region is also known. In the bipolar transistor with this structure, there is an advantage of being able to improve voltage resistance by securing a long distance between the collector region and the emitter region. However, due to the long distance between the collector region and the emitter region, a moving distance of carriers also becomes long, and there are cases in which the current amplification rate decreases.

En the present description, a bipolar transistor that can improve the voltage resistance while improving its current amplification rate is disclosed.

Solution to Technical Problem

An aspect of a technique described in this specification is a bipolar transistor comprising a semiconductor substrate. The semiconductor substrate comprises: a p-type emitter region located in a part of a front surface of the semiconductor substrate; a p-type collector region located in a part of the front surface of the semiconductor substrate; an n-type base region located between the emitter region and the collector region in a part of the front surface of the semiconductor substrate; a p-type first embedded region located below the base region; and an n-type region having a lower n-type impurity concentration than the base region, being in contact with the emitter region, the collector region, the base region and the first embedded region, separating the emitter region from the base region and the first embedded region, and separating the collector region from the base region and the first embedded region. The base region comprises a first base region positioned above the first embedded region; and a second base region positioned on a collector region side than the first base region. The second base region has a higher n-type impurity concentration than the first base region.

In the above bipolar transistor, the base region is arranged between the collector region and the emitter region, so a distance between the collector region and the emitter region can be secured long, and thus can improve the voltage resistance. Further, there is the p-type first embedded region provided under the n-type base region in the semiconductor layer. In a case where carriers (holes) move between emitter and collector, electrical charges and the carriers are not bound together in the first embedded region and thus no loss is generated. Due to this, decrease in current amplification rate can be suppressed. According to the bipolar transistor as above, the voltage resistance can be improved at the same time as improving the current amplification rate.

Further, in the above bipolar transistor, the base region comprises the first base region positioned above the first embedded region, and the second base region positioned closer to the collector region side than the first base region is. The second base region has a higher n-type impurity concentration than the first base region. Due to this, a depletion layer generated between the collector and the base when the bipolar transistor is turned off can be suppressed from reaching beyond the second base region toward the first base region side. As a result, the depletion layer can be suppressed from reaching an inside of the first embedded region. That is, depletion of the first embedded region can be suppressed. Due to this, upon switching the bipolar transistor from an off state to an on state, an amount of holes supplied to the depleted region can be reduced, so a turn-on time can be shortened.

The semiconductor substrate may further comprise a stopping region having a higher n-type impurity concentration than the n-type region, partially being in contact with the first embedded region from the collector region side, and being separated from the emitter region and the collector region by the n-type region.

According to this configuration, since the stopping region partially in contact with the first embedded region from the collector region side is provided, the depletion layer is further suppressed from reaching the inside of the first embedded region when the bipolar transistor is turned off. Due to this, upon switching the bipolar transistor from the off state to the on state, the amount of holes supplied to the region which had been depleted during the off time can further be reduced, so the turn-on time can further be shortened.

The semiconductor substrate may further comprise a p-type second embedded region located below the first embedded region and separated from the emitter region, the collector region and the first embedded region by the n-type region.

According to this configuration, a loss generated upon when the holes move between the emitter and the collector can further be reduced. Due to this, the current amplification rate can further be improved.

Another aspect of a technique described in this specification is a bipolar transistor comprising a semiconductor substrate. The semiconductor substrate may comprise: an n-type emitter region located in a part of a front surface of the semiconductor substrate; an n-type collector region located in a part of the front surface of the semiconductor substrate; a p-type base region located between the emitter region and the collector region in a part of the front surface of the semiconductor substrate; an n-type first embedded region located below the base region; and a p-type region having a lower p-type impurity concentration than the base region, being in contact with the emitter region, the collector region, the base region and the first embedded region, separating the emitter region from the base region and the first embedded region, and separating the collector region from the base region and the first embedded region. The base region comprises: a first base region positioned above the first embedded region; and a second base region positioned on an emitter region side than the first base region. The second base region has a higher p-type impurity concentration than the first base region.

In this bipolar transistor as well, the voltage resistance can be improved at the same time as improving the current amplification rate. Notably, in this bipolar transistor, the carriers moving between the emitter and the collector are electrons.

Further, in the above bipolar transistor, the base region comprises the first base region positioned above the first embedded region and the second base region positioned closer to the emitter region side than the first base region is. The second base region has a higher p-type impurity concentration than the first base region. Due to this, the depletion layer generated between the emitter and the base when the bipolar transistor is turned off can be suppressed from reaching beyond the second base region toward the first base region side. As a result, the depletion layer can be suppressed from reaching the inside of the first embedded region. That is, the depletion of the first embedded region can be suppressed. Due to this, upon switching the bipolar transistor from the off state to the on state, an amount of electrons supplied to the region that had been depleted during the off time can be reduced, so the turn-on time can be shortened.

The semiconductor substrate may further comprise a stopping region having a higher p-type impurity concentration than the p-type region, partially being in contact with the first embedded region from the emitter region side, and being separated from the emitter region and the collector region by the p-type region.

According to this configuration, since the stopping region partially in contact with the first embedded region from the emitter region side is provided, the depletion layer is further suppressed from reaching the inside of the first embedded region when the bipolar transistor is turned off. Due to this, upon switching the bipolar transistor from the off state to the on state, the amount of electrons supplied to the region that had been depleted during the off time can further be reduced, so the turn-on time can further be shortened.

The semiconductor substrate may further comprise an n-type second embedded region located below the first embedded region and separated from the emitter region, the collector region and the first embedded region by the p-type region.

According to this configuration, a loss generated upon when the electrons move between the emitter and the collector can further be reduced. Due to this, the current amplification rate can further be improved.

DESCRIPTION OF EMBODIMENTS

First Embodiment

Figure 1:
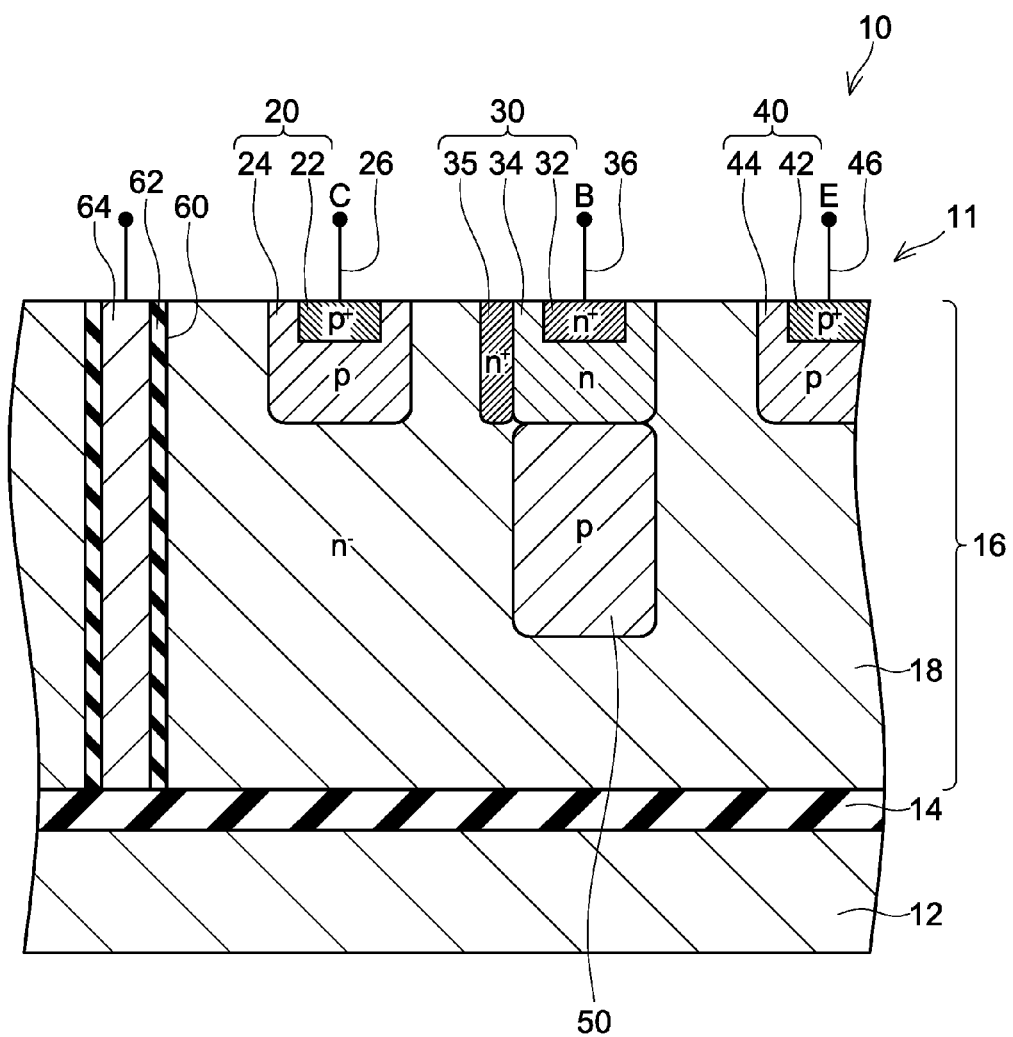
FIG. 1 is a cross sectional view of a bipolar transistor of a first embodiment.

As shown in FIG. 1, a bipolar transistor 10 of the present embodiment comprises a semiconductor substrate 11 composed primarily of Si. The semiconductor substrate 11 comprises a rear surface layer 12, an embedded insulating film 14 provided on a front surface side of the rear surface layer 12 (upper side of FIG. 1), and a semiconductor layer 16 provided on the front surface side of the embedded insulating film 14. Further, electrodes 26, 36, 46 and metal wirings and the like (not shown) are provided on a front surface of the semiconductor substrate 11. The bipolar transistor 10 of the present embodiment is a lateral pup transistor.

A p-type emitter region 40, a p-type collector region 20, an n-type base region 30, a p-type first embedded region 50, and an n-type region 18 are provided in the semiconductor layer 16. The emitter region 40, the collector region 20, and the base region 30 are provided respectively at parts of the front surface of the semiconductor layer 16. Further, the base region 30 is provided between the emitter region 40 and the collector region 20. The first embedded region 50 is provided below the base region 30.

An n-type impurity concentration of the n-type region 18 is lower than an n-type impurity concentration of a low-concentration region 34 of the base region 30. Here, the term "impurity concentration" means an average impurity concentration in the relevant region. Hereinbelow, the same applies to the case of referring to "impurity concentration" in this description. The n-type region 18 makes contact with the emitter region 40, the collector region 20, the base region 30, and the first embedded region 50. The n-type region 18 separates the emitter region 40 from the base region 30, the first embedded region 50, and the collector region 20. The n-type region 18 separates the collector region 20 from the base region 30, the first embedded region 50, and the emitter region 40.

The emitter region 40 comprises a high-concentration region 42 having a high p-type impurity concentration and a low-concentration region 44 having a lower p-type impurity concentration than the high-concentration region 42. The emitter region 40 is provided in an island-shape in a region exposed on the front surface of the semiconductor layer 16. The emitter electrode 46 is connected to a front surface of the emitter region 40.

The collector region 20 comprises a high-concentration region 22 having a high p-type impurity concentration and a low-concentration region 24 having a lower p-type impurity concentration than the high-concentration region 22. The collector region 20 is provided in an island-shape in a region exposed on the front surface of the semiconductor layer 16. The collector region 20 is provided with an interval from the emitter region 40. The collector electrode 26 is connected to a front surface of the collector region 20.

The base region 30 comprises a first high-concentration region 32 having a high n-type impurity concentration, a low-concentration region 34 having a lower n-type impurity concentration than the first high-concentration region 32, and a second high-concentration region 35 having a higher n-type impurity concentration than the low-concentration region 34. The base region 30 is also provided in an island-shape in a region exposed on the front surface of the semiconductor layer 16. As described above, the base region 30 is provided between the collector region 20 and the emitter region 40. The base electrode 36 is connected to a front surface of the base region 30.

In the present embodiment, the low-concentration region 34 and the first high-concentration region 32 are positioned above the first embedded region 50. The first high-concentration region 32 is provided in a region exposed on the front surface of the semiconductor layer 16. The low-concentration region 34 is provided by surrounding a lateral side and a bottom of the first high-concentration region 32. The second high-concentration region 35 is positioned on a collector region 20 side than the low-concentration region 34. The first embedded region 50 is not arranged below the second high-concentration region 35. In other words, the second high-concentration region 35 projects out toward the collector region 20 side than the first embedded region 50 does. Further, the second high-concentration region 35 is provided to about the same depth as the low-concentration region 34 in a depth direction from the front surface of the semiconductor layer 16.

An n-type impurity concentration of the second high-concentration region 35 is higher than an n-type impurity concentration of the low-concentration region 34. Further, in the present embodiment, the n-type impurity concentration of the second high-concentration region 35 is higher than an n-type impurity concentration of the first high-concentration region 32. However, in a variant, the n-type impurity concentration of the second high-concentration region 35 may be equal to the n-type impurity concentration of the first high-concentration region 32, or may be lower than the n-type impurity concentration of the first high-concentration region 32.

The first high-concentration region 32, the low-concentration region 34, and the second high-concentration region 35 are all regions formed by injecting n-type impurities to the n-type region 18. Due to this, the n-type impurity concentration of the first high-concentration region 32, the n-type impurity concentration of the low-concentration region 34, and the n-type impurity concentration of the second high-concentration region 35 are all higher than an n-type impurity concentration of the n-type region 18. In the n-type region 18, the concentration of the n-type impurities is substantially uniform, whereas the base region 30 has the impurity concentration that is even higher than the aforementioned uniform n-type impurity concentration. In the present embodiment, the n-type impurity concentration of the n-type region 18 is less than $1 \times 10^{15}$ atoms/cm$^3$, and the n-type impurity concentration of the base region 30 is equal to or greater than $1 \times 10^{17}$ atoms/cm$^3$.

The first embedded region 50 is located under the low-concentration region 34 and the first high-concentration region 32 within the base region 30 as aforementioned. In the present embodiment, the first embedded region 50 is provided so as to make contact with a lower end of the low-concentration region 34.

An isolation trench 60 for isolating the bipolar transistor 10 from other regions (not shown) is provided in the semiconductor layer 16. The isolation trench 60 extends downward from the front surface of the semiconductor layer 16, and reaches a front surface of the embedded insulating film 14. An isolation insulating layer 62 that covers an inner wall of the isolation trench 60 is provided in the isolation trench 60. An embedded electrode 64 is provided inside the isolation insulating layer 62. Although not shown in FIG. 1, in the present embodiment, the embedded electrode 64 is connected to the collector electrode 26. Due to this, the embedded electrode 64 has the same potential as the collector electrode 26.

Next, an operation of the bipolar transistor 10 of the present embodiment will be described. The bipolar transistor 10 turns on when a voltage that charges the emitter electrode 46 positively (that is, forward voltage for the bipolar transistor 10) is applied between the emitter electrode 46 and the collector electrode 26 and a predetermined ON potential is applied to the base electrode 36. That is, electrons move through the n-type region 18 from the collector region 20 toward the emitter region 40, and carriers (holes) move from the emitter region 40 toward the collector region 20. Due to this, current flows from the emitter electrode 46 to the collector electrode 26. Most of the holes pass through the first embedded region 50 when they move from the emitter region 40 toward the collector region 20. The electrons and holes are not bound within the first embedded region 50, so no loss is generated. Due to this, a substantial moving distance for the holes is shortened by a length of the first embedded region 50 upon when the holes move from the emitter region 40 to the collector region 20. As a result, a current amplification rate of the bipolar transistor 10 can be improved.

Further, as described above, in the bipolar transistor 10 of the present embodiment, since the base region 30 is arranged between the collector region 20 and the emitter region 40, a long distance between the collector region 20 and the emitter region 40 can be ensured, and the voltage resistance can thereby be improved. Thus, the bipolar transistor 10 has a high voltage resistance and a high current amplification rate.

Figure 2:
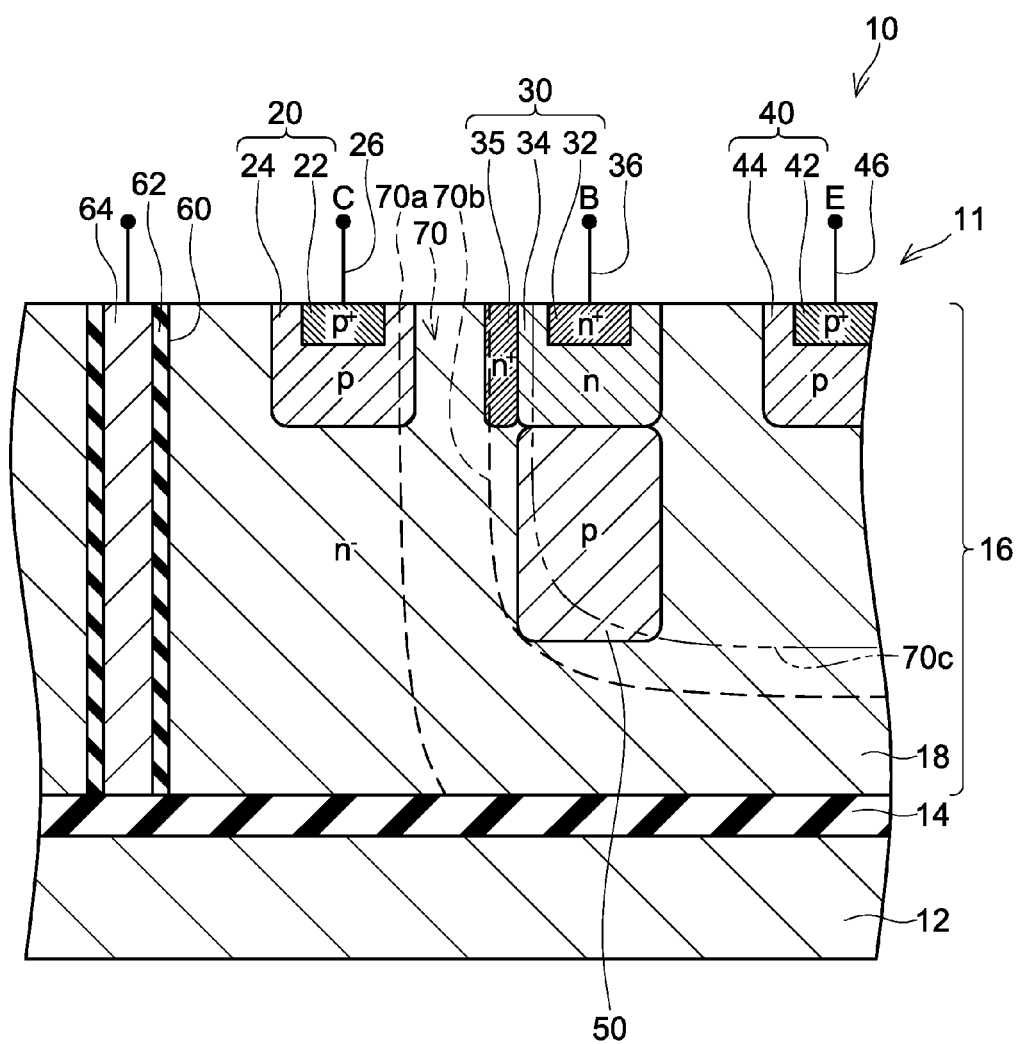
FIG. 2 is a schematic view of a state where the bipolar transistor of the first embodiment is turned off.

When the potential applied to the emitter electrode 46 and the base electrode 36 is brought to zero while the bipolar transistor 10 is on, the bipolar transistor 10 is turned off. In this case, there is no potential difference between the emitter electrode 46 and the base electrode 36, and the potential of the collector electrode 26 comes to be in a state of being lower than the potential of the emitter electrode 46 and the base electrode 36 (state in which negative potential is applied). In this case, as shown in FIG. 2, a depletion layer 70 is generated between the collector and the base. One end 70a of the depletion layer 70 reaches an inside of the low-concentration region 22 of the collector region 20. Further, the other end 70b of the depletion layer 70 reaches the second high-concentration region 35. At this occasion, since the n-type impurity concentration of the second high-concentration region 35 is high, the depletion layer 70 stops to spread in the second high-concentration region 35. Due to this, the depletion layer 70 is prevented from extending beyond the second high-concentration region 35 toward the low-concentration region 34 side. As a result, the end 70b of the depletion layer 70 does not reach an inside of the first embedded region 50. The first embedded region 50 will not be depleted.

Here, as a comparative example, a case will be considered in which the base region 30 in the bipolar transistor 10 is not provided with the second high-concentration region 35. In this case, as shown by a two-dot chain line in FIG. 2, the other end 70c of the depletion layer 70 reaches an inside of the low-concentration region 34, and also reaches the inside of the first embedded region 50. That is, a part of the first embedded region 50 is depleted. Within the first embedded region 50, no hole is present in the part existing within the depleted portion. Due to this, in the bipolar transistor of the comparative example, holes must be supplied upon the turn-on to the first embedded region 50 that had been depleted, so the turn-on time is elongated.

Contrary to this, the base region 30 of the bipolar transistor 10 of the present embodiment comprises the second high-concentration region 35 as described above, so the first embedded region 50 is not depleted upon the turn-off. Due to this, no holes need to be supplied to the first embedded region 50 upon the turn-on. Due to this, upon switching the bipolar transistor 10 from the off state to the on state, the number of holes that needs to be supplied to the region which had been depleted during the off time is small, so the turn-on time can be shortened.

In the above, the configuration and operation of the bipolar transistor 10 of the present embodiment have been described. In the present embodiment, the low-concentration region 34 corresponds to an example of "a first base region", and the second high-concentration region 35 corresponds to an example of "a second base region".

Variant of First Embodiment

Figure 3:
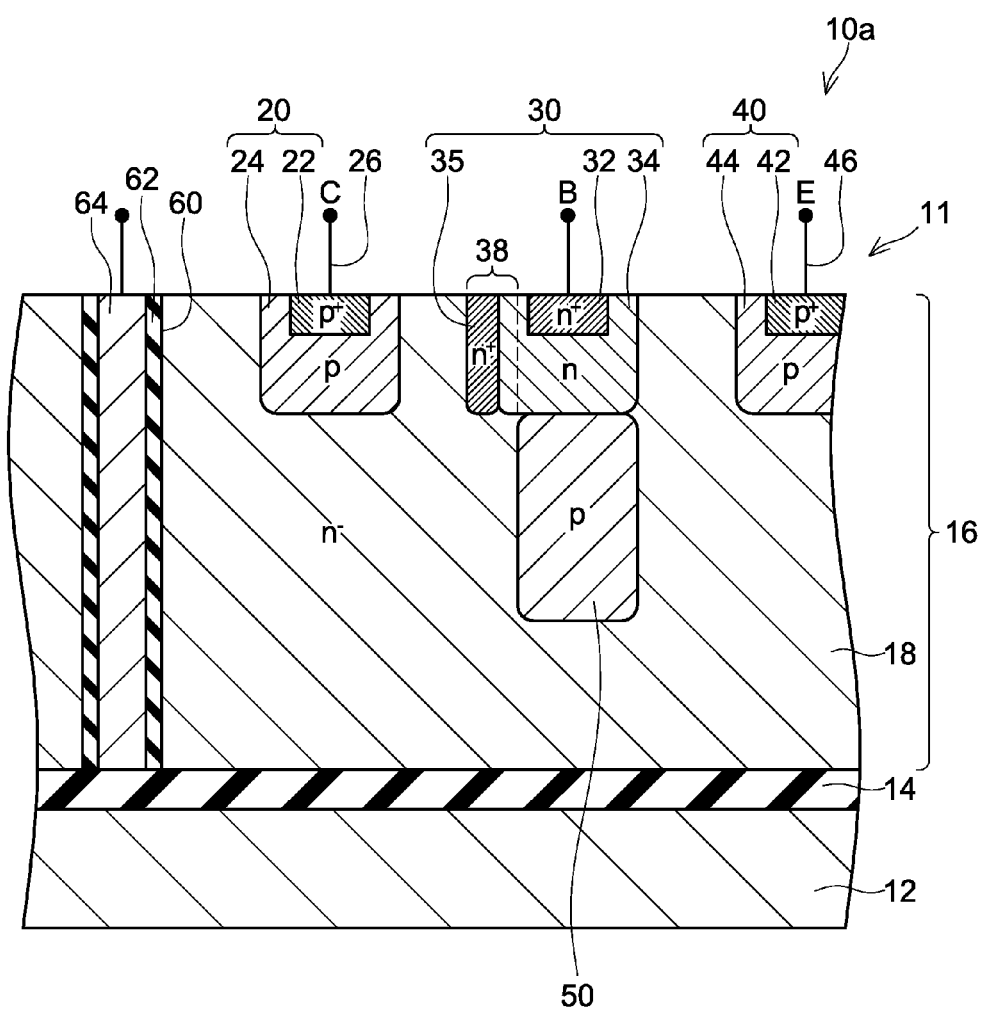
FIG. 3 is a cross sectional view of a bipolar transistor of a variant of the first embodiment.

A bipolar transistor 10a of FIG. 3 is a variant of the first embodiment. As shown in FIG. 3, a part of a projecting region 38 that projects out toward the collector region 20 side than the first embedded region 50 does may be the second high-concentration region 35, and remaining portion of the projecting region 38 may be the low-concentration region 34. Even in such a configuration, the spreading of the depletion layer can be stopped by the projecting region 38 due to the n-type impurity concentration of the projecting region 38 (more specifically, an average impurity concentration of the projecting region 38) being high. Due to this, even by such a configuration, the turn-on time can be shortened similar to the first embodiment. Notably, in this variant, the projecting region 38 corresponds to an example of "a second base region", and the remainder of the base region 30 corresponds to an example of "a first base region".

Second Embodiment

Figure 4:
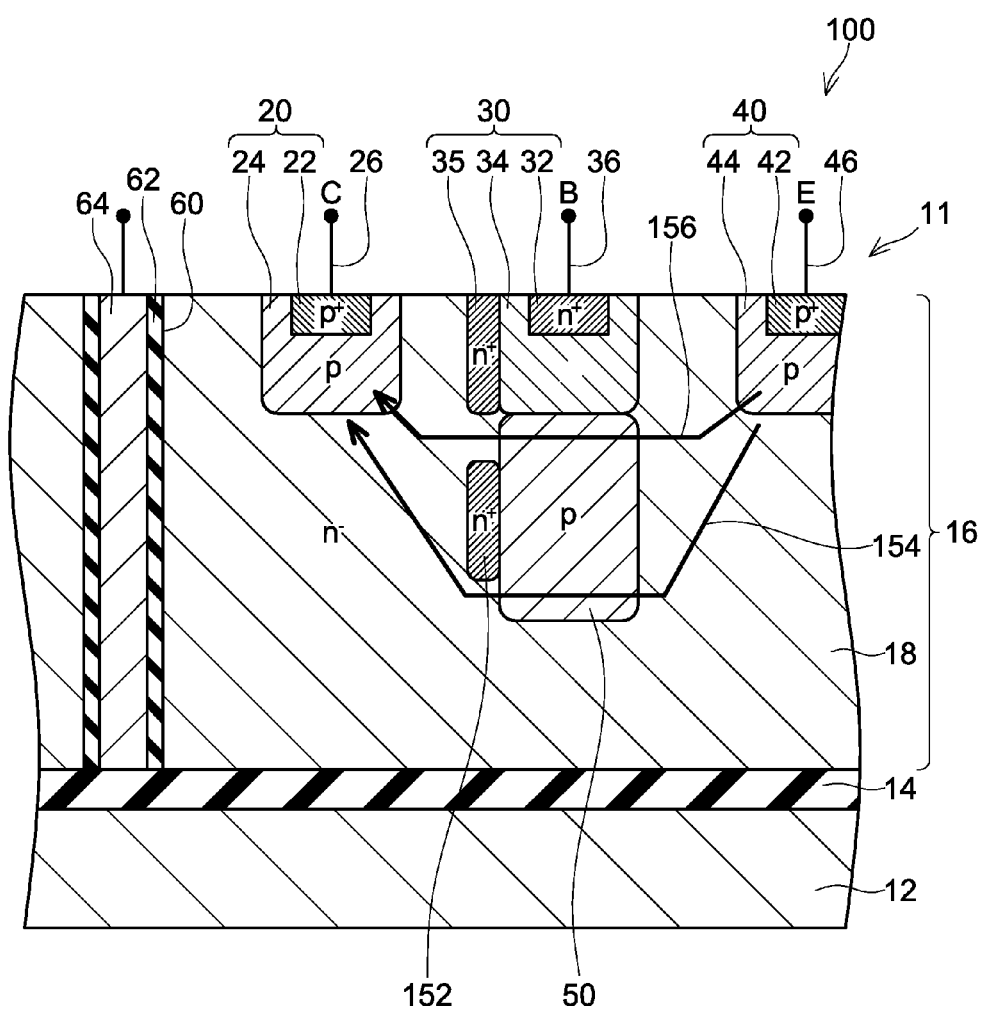
FIG. 4 is a cross sectional view of a bipolar transistor of a second embodiment.

Next, a bipolar transistor 100 of a second embodiment will be described by referring to FIG. 4, by focusing the description primarily on the differences from the first embodiment. The bipolar transistor 100 of the present embodiment differs from the first embodiment in that an n-type stopping region 152 making partial contact with the first embedded region 50 from the collector region 20 side is provided.

In the present embodiment, an n-type impurity concentration of the stopping region 152 is substantially equal to the n-type impurity concentration of the second high-concentration region 35. Notably, in a variant, the n-type impurity concentration of the stopping region 152 can be any arbitrary concentration so long as it is higher than the n-type impurity concentration of the n-type region 18.

In the present embodiment as well, in a case where the bipolar transistor 100 is turned on and the carriers (holes) move from the emitter region 40 toward the collector region 20, some of the holes will be moving through the first embedded region 50. At this occasion, the holes passing through the first embedded region 50 pass through the first embedded region 50 by going through a portion where the stopping region 152 does not exist, as indicated by arrows 154, 156 in FIG. 4. That is, the bipolar transistor 100 of the present embodiment also has a high voltage resistance and a high current amplification rate similar to the first embodiment.

Further, the bipolar transistor 100 of the present embodiment comprises the stopping region 152 on the collector region 20 side of the first embedded region 50. Due to this, a depletion layer that is generated between the collector and the base when the bipolar transistor 100 is turned off may reach the stopping region 152, but will suitably be prevented from reaching the inside of the first embedded region 50. Due to this, upon switching the bipolar transistor 100 from the of state to the on state, the amount of holes supplied to the region that had been depleted can be reduced, so the turn-on time can further be shortened.

Third Embodiment

Figure 5:
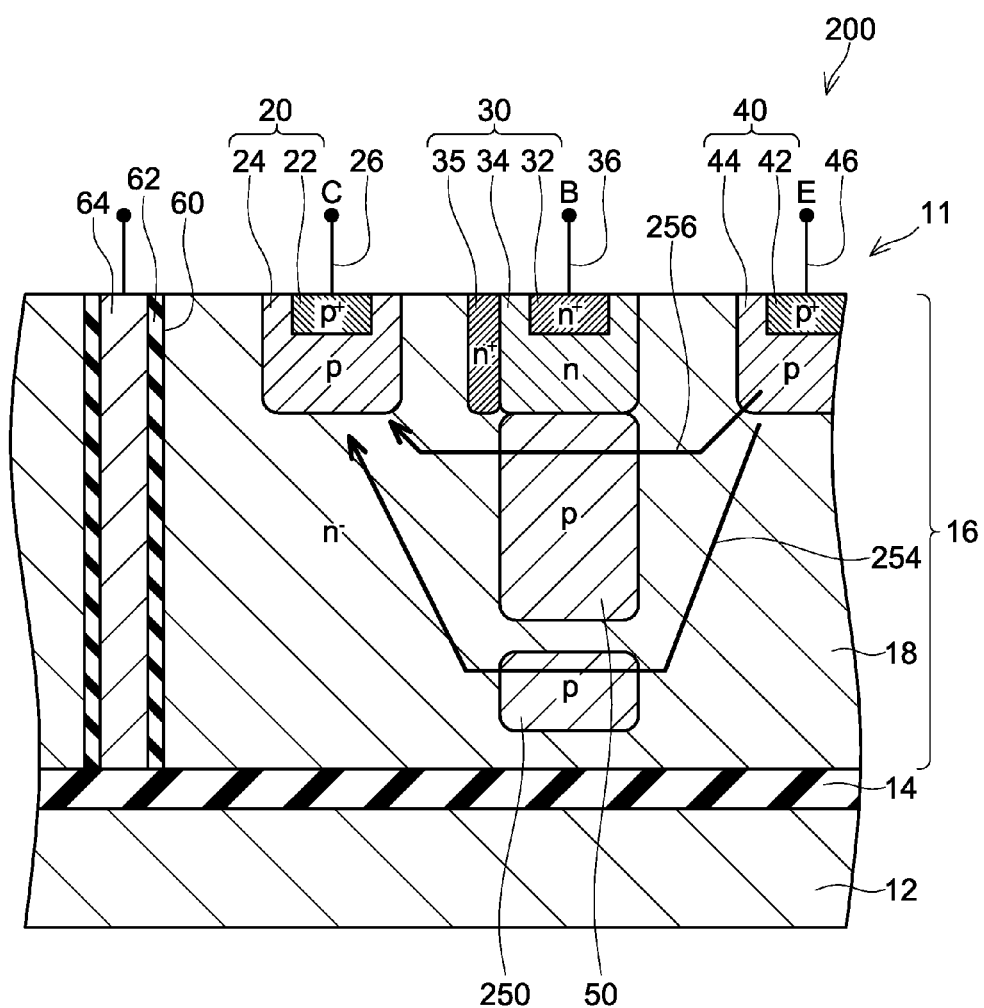
FIG. 5 is a cross sectional view of a bipolar transistor of a third embodiment.

Next, a bipolar transistor 200 of a third embodiment will be described by referring to FIG. 5, by focusing the description primarily on the differences from the first embodiment. The bipolar transistor 200 of the present embodiment differs from the first embodiment in that a p-type second embedded region 250 is provided under the first embedded region 50 with an interval from the first embedded region 50.

The bipolar transistor 200 of the present embodiment can achieve substantially the same effects as the bipolar transistor 10 of the first embodiment. Further, in the present embodiment, as described above, the second embedded region 250 is provided under the first embedded region 50. Due to this, in a case where the bipolar transistor 200 is turned on and the carriers (holes) move from the emitter region 40 toward the collector region 20, a greater number of holes will be moving through the first and second embedded regions 50, 250. That is, the greater number of holes enables the substantial moving distance to be shortened by lengths of the first and second embedded regions 50, 250. Thus, the current amplification rate can further be improved. Further, passages through which the holes move become more easily dispersed (see arrows 254, 256 in the drawing), so heat generation in the bipolar transistor 200 can also be suppressed.

Fourth Embodiment

Figure 6:
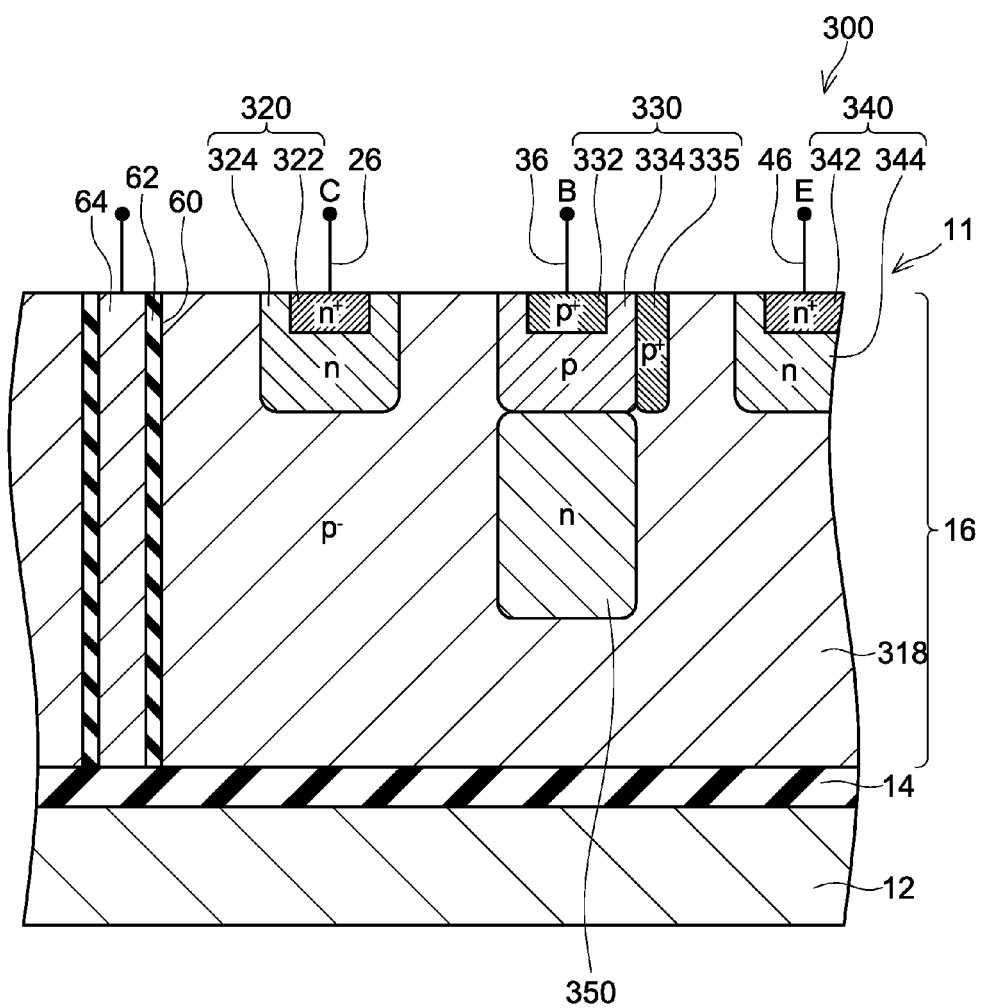
FIG. 6 is a cross sectional view of a bipolar transistor of a fourth embodiment.

Next, a bipolar transistor 300 of a fourth embodiment will be described by referring to FIG. 6, by focusing the description primarily on the differences from the first embodiment. The bipolar transistor 300 of the present embodiment differs from the first embodiment in that it is a lateral npn transistor.

In the present embodiment, an n-type emitter region 340, an n-type collector region 320, a p-type base region 330, an n-type first embedded region 350, and a p-type region 318 are provided in the semiconductor layer 16. Arrangements of the respective regions are similar to the arrangements of the first embodiment.

In the present embodiment, a shape of the base region 330 differs from the first embodiment. The base region 330 comprises a first high-concentration region 332 having a high p-type impurity concentration, a low-concentration region 334 having a lower p-type impurity concentration than the first high-concentration region 332, and a second high-concentration region 335 having a higher p-type impurity concentration than the low-concentration region 334. In the present embodiment as well, the low-concentration, region 334 and the first high-concentration region 332 are positioned above the first embedded region 350. The first high-concentration region 332 is provided in an island-shape in a region exposed on the front surface of the semiconductor layer 16. The low-concentration region 334 is provided by surrounding a lateral side and a bottom of the first high-concentration region 332. The second high-concentration region 335 is positioned on an emitter region 340 side than the low-concentration region 334. The first embedded region 350 is not arranged below the second high-concentration region 335. In other words, the second high-concentration region 335 projects out toward the emitter region 340 side than the first embedded region 350 does. Further, the second high-concentration region 335 is provided to substantially the same depth as the low-concentration region 334 in the depth direction from the front surface of the semiconductor layer 16.

A p-type impurity concentration of the second high-concentration region 335 is higher than a p-type impurity concentration of the low-concentration region 334. Further, in the present embodiment, the p-type impurity concentration of the second high-concentration region 335 is higher than the p-type impurity concentration of the first high-concentration region 332, however, in another variant, the p-type impurity concentration of the second high-concentration region 335 may be equal to the p-type impurity concentration of the first high-concentration region 332, or may be lower than the p-type impurity concentration of the first high-concentration region 332.

The first high-concentration region 332, the low-concentration region 334, and the second high-concentration region 335 are all regions formed by injecting p-type impurities to the p-type region 318. Due to this, the p-type impurity concentration of the first high-concentration region 332, the p-type impurity concentration of the low-concentration region 334, and the p-type impurity concentration of the second high-concentration region 335 are all higher than a p-type impurity concentration of the p-type region 318. In the p-type region 318, the concentration of the p-type impurities is substantially uniform, whereas the base region 330 has the impurity concentration that is even higher than the aforementioned uniform p-type impurity concentration. In the present embodiment, the p-type impurity concentration of the p-type region 318 is less than $1 \times 10^{15}$ atoms/cm$^3$, and the p-type impurity concentration of the base region 330 is equal to or greater than $1 \times 10^{17}$ atoms/cm$^3$.

The first embedded region 350 is located under the low-concentration region 334 and the first high-concentration region 332 within the base region 330 as aforementioned. In the present embodiment, the first embedded region 350 is provided so as to make contact with a lower end of the low-concentration region 334.

The emitter region 340 comprises a high-concentration region 342 having a high n-type impurity concentration, and a low-concentration region 344 having a lower n-type impurity concentration than the high-concentration region 342. The collector region 320 comprises a high-concentration region 322 having a high n-type impurity concentration, and a low-concentration region 324 having a lower n-type impurity concentration than the high-concentration region 322.

Next, an operation of the bipolar transistor 300 of the present embodiment will be described. The bipolar transistor 300 turns on when a voltage that charges the collector electrode 26 positively (that is, forward voltage for the bipolar transistor 300) is applied between the collector electrode 26 and the emitter electrode 46 and a predetermined ON potential is applied to the base electrode 36. That is, holes move through the p-type region 318 from the collector region 320 toward the emitter region 340, and carriers (electrons) move from the emitter region 340 toward the collector region 320. Due to this, current flows from the collector electrode 26 to the emitter electrode 46. Most of the electrons pass through the first embedded region 350 when they move from the emitter region 340 toward the collector region 320. The electrons and holes are not bound within the first embedded region 350, so no loss is generated. Due to this, a substantial moving distance for the electrons is shortened by a length of the first embedded region 350 upon when the electrons move from the emitter region 340 to the collector region 320. As a result, a current amplification rate of the bipolar transistor 300 can be improved.

Further, in the present embodiment also, since the base region 330 is arranged between the collector region 320 and the emitter region 340, a long distance can be ensured between the collector region 320 and the emitter region 340, and a voltage resistance can be improved. Thus, in the bipolar transistor 300 of the present embodiment also, the voltage resistance is high, and the current amplification rate is high.

Figure 7:
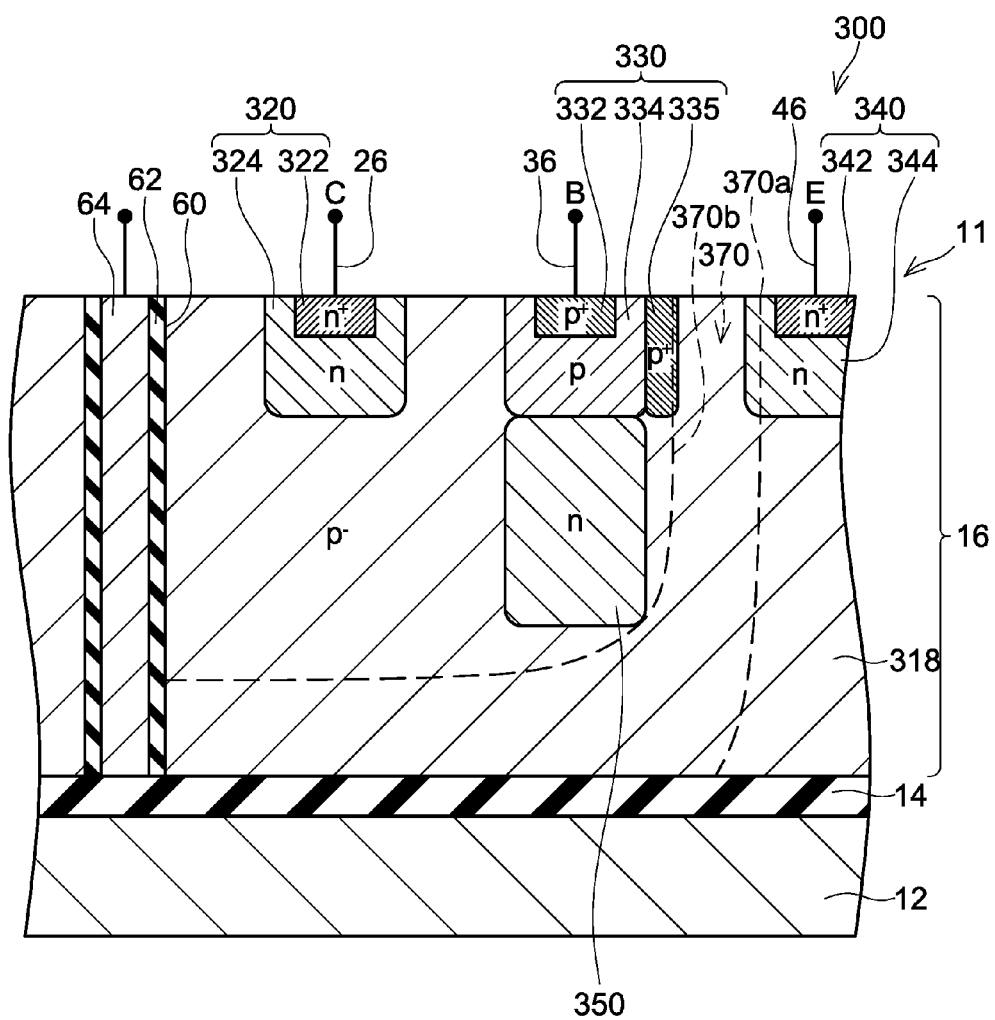
FIG. 7 is a schematic view of a state where the bipolar transistor of the fourth embodiment is turned off.

When the potential applied to the collector electrode 26 and the base electrode 36 is brought to zero, the bipolar transistor 300 is turned off. In this case, there is no potential difference between the collector electrode 26 and the base electrode 36, and the potential of the emitter electrode 46 comes to be in a state of being lower than the potential of the collector electrode 26 and the base electrode 36 (state in which negative potential is applied). In this case, as shown in FIG. 7, a depletion layer 370 is generated between the emitter and the base. One end 370a of the depletion layer 370 reaches an inside of the low-concentration region 342 of the emitter region 340. Further, the other end 370b of the depletion layer 370 reaches the second high-concentration region 335. At this occasion, since the p-type impurity concentration of the second high-concentration region 335 is high, the depletion layer 370 stops to spread in the second high-concentration region 335. Due to this, the depletion layer 370 is prevented from extending beyond the second high-concentration region 335 toward the low-concentration region 334 side. As a result, the other end 370b of the depletion layer 370 does not reach an inside of the first embedded region 350. That is, the first embedded region 350 will not be depleted. Due to this, in the present embodiment as well, upon switching the bipolar transistor 300 from the off state to the on state, the number of holes that needs to be supplied to the region which had been depleted during the off time is relatively small, so the turn-on time can be shortened.

In the above, the configuration and operation of the bipolar transistor 300 of the present embodiment have been described. In the present embodiment, the low-concentration region 334 corresponds to an example of "a first base region", and the second high-concentration region 335 corresponds to an example of "a second base region".

Variant of Fourth Embodiment

Figure 8:
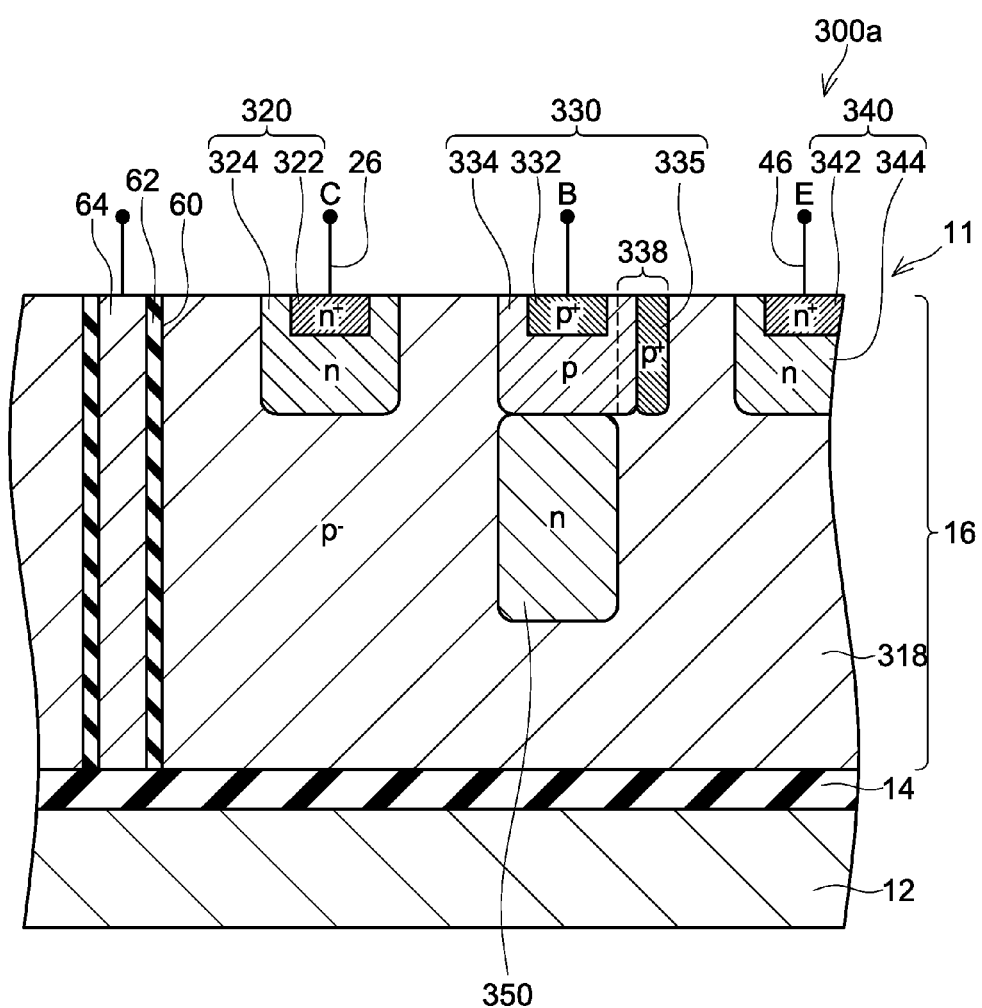
FIG. 8 is a cross sectional view of a bipolar transistor of a variant of the fourth embodiment.

A bipolar transistor 300a of FIG. 8 is a variant of the fourth embodiment. As shown in FIG. 8, a part of a projecting region 338 projecting out toward an emitter region 340 side than the first embedded region 350 does is the second high-concentration region 335, and remaining portion of the projecting region 338 may be the low-concentration region 334. Even in such a configuration, the spreading of the depletion layer can be stopped by the projecting region 338 due to the p-type impurity concentration of the projecting region 338 (more specifically, an average impurity concentration of the projecting region 338)

being high. Due to this, even by such a configuration, the turn-on time can be shortened similar to the fourth embodiment. Notably, in this variant, the projecting region 338 corresponds to an example of "a second base region", and the remainder of the base region 330 corresponds to an example of "a first base region".

Fifth Embodiment

Figure 9:
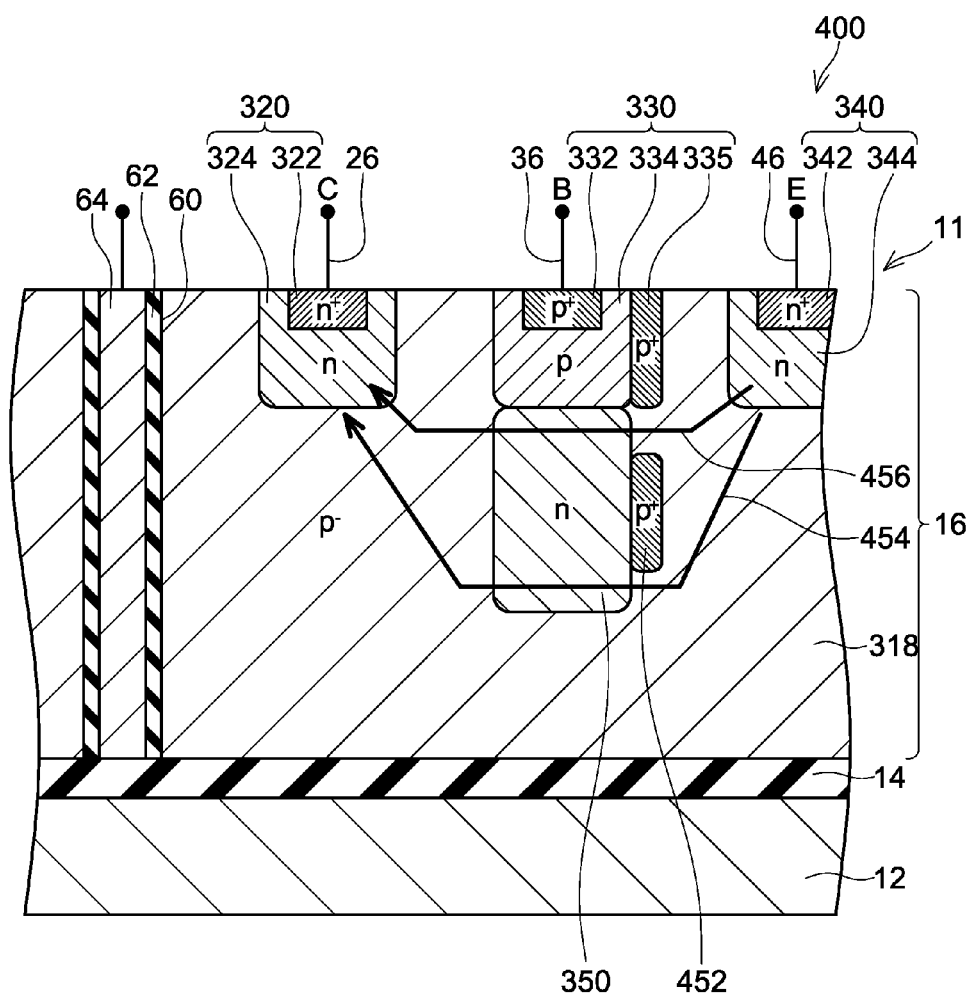
FIG. 9 is a cross sectional view of a bipolar transistor of a fifth embodiment.

Next, a bipolar transistor 400 of a fifth embodiment will be described by referring to FIG. 9, by focusing the description primarily on the differences from the fourth embodiment. The bipolar transistor 400 of the present embodiment differs from the fourth embodiment in that it is provided with a p-type stopping region 452 that makes partial contact with the first embedded region 350 from the emitter region 340 side.

In the present embodiment, a p-type impurity concentration of the stopping region 452 is substantially equal to the p-type impurity concentration of the second high-concentration region 335. Notably, in a variant, the p-type impurity concentration of the stopping region 452 can be any arbitrary concentration so long as it is higher than the p-type impurity concentration of the p-type region 318.

In the present embodiment as well, in a case where the bipolar transistor 400 is turned on and the carriers (electrons) move from the emitter region 340 toward the collector region 320, some of the electrons will be moving through the first embedded region 350. At this occasion, the electrons passing through the first embedded region 350 pass through the first embedded region 350 by going through a portion where the stopping region 452 does not exist, as indicated by arrows 454, 456 in FIG. 9. That is, the bipolar transistor 400 of the present embodiment also has a high voltage resistance and a high current amplification rate similar to the fourth embodiment.

Further, the bipolar transistor 400 of the present embodiment comprises the stopping region 452 on the emitter region 340 side of the first embedded region 350. Due to this, a depletion layer that is generated between the emitter and the base when the bipolar transistor 400 is turned off may reach the stopping region 452, but will suitably be prevented from reaching the inside of the first embedded region 350. Due to this, upon switching the bipolar transistor 400 from the off state to the on state, the amount of electrons supplied to the region that had been depleted can be reduced, so the turn-on time can further be shortened.

Sixth Embodiment

Figure 10:
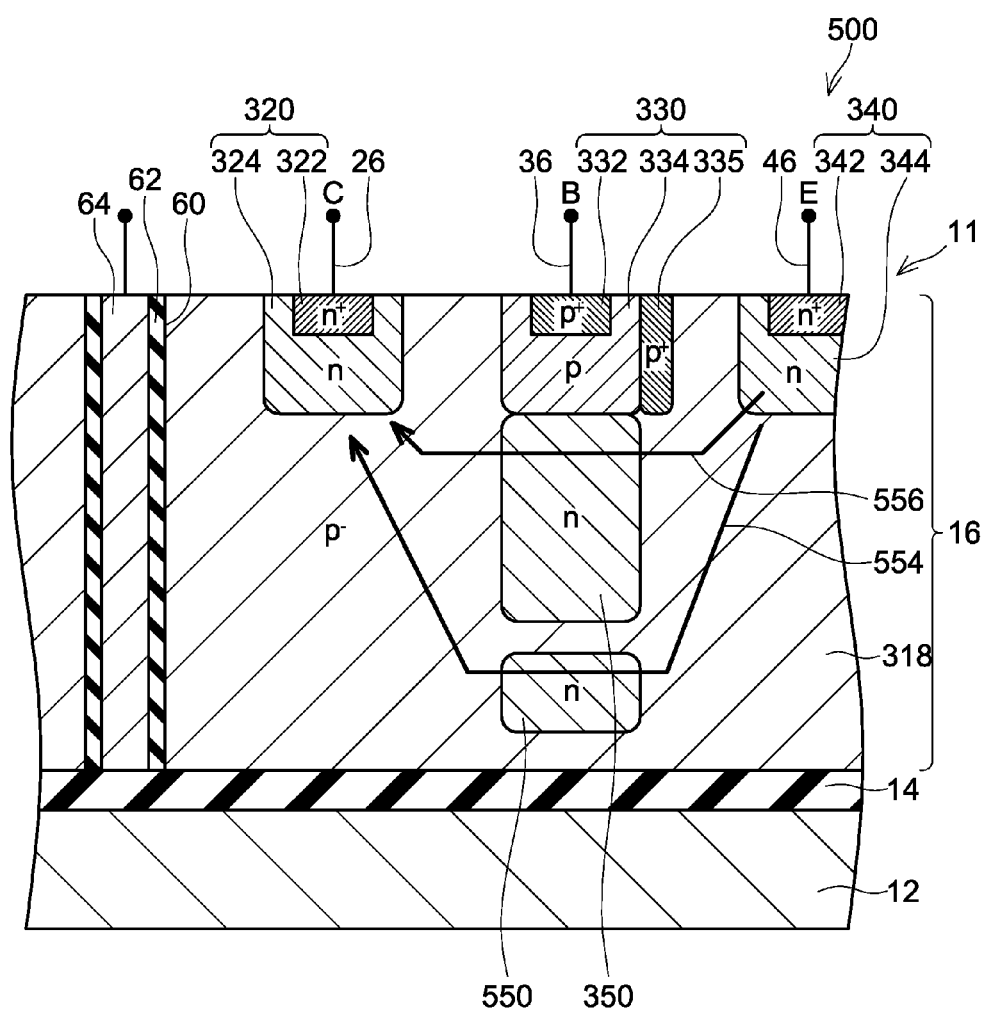
FIG. 10 is a cross sectional view of a bipolar transistor of a sixth embodiment.

Next, a bipolar transistor 500 of a sixth embodiment will be described by referring to FIG. 10, by focusing the description primarily on the differences from the fourth embodiment. The bipolar transistor 500 of the present embodiment differs from the fourth embodiment in that an n-type second embedded region 550 is provided under the first embedded region 350 with an interval from the first embedded region 350.

The bipolar transistor 500 of the present embodiment can achieve substantially the same effects as the bipolar transistor 300 of the fourth embodiment. Further, in the present embodiment, as described above, the second embedded region 550 is provided under the first embedded region 350. Due to this, in a case where the bipolar transistor 500 is turned on and the carriers (electrons) move from the emitter region 340 toward the collector region 320, a greater number of electrons will be moving through the first and second embedded regions 350, 550. That is, the greater number of electrons enables the substantial moving distance to be shortened by lengths of the first and second embedded regions 350, 550. Thus, the current amplification rate can further be improved. Further, passages through which the electrons move become more easily dispersed (see arrows 554, 556 in the drawing), so heat generation in the bipolar transistor 500 can also be suppressed.

Specific examples of the art disclosed herein have been described in detail, however, these are mere exemplary indications and thus do not limit the scope of the claims. The art described in the claims include modifications and variations of the specific examples presented above. For example, the following variants may be implemented.

(Variant 1)

In the above third embodiment, the p-type first and second embedded regions 50, 150 are provided under the n-type base region 30. Not being limited to this, p-type embedded regions may be provided at three or more different positions under the n-type base region 30. Similarly, in the above sixth embodiment, three or more n-type embedded regions may be provided under the p-type base region 330.

(Variant 2)

In each of the above embodiments, the second high-concentration region 35(335) of the base region 30(330) is provided at about the same depth as the low-concentration region 34(334) in the depth direction from the front surface of the semiconductor layer 16. Not being limited to this, the second high-concentration region 35(335) may be provided shallower than the low-concentration region 34(334).

(Variant 3)

In each of the above embodiments, the first embedded region 50(350) is provided so as to make contact with the lower end of the base region 30(330). Not being limited to this, the first embedded region 50(350) may be provided with an interval from the low-concentration region 34(334), so long as it is located under the low-concentration region 34(334) of the base region 30(330).

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A bipolar transistor comprising a semiconductor substrate,
   wherein the semiconductor substrate comprises:
   a p-type emitter region located in a first part of a front surface of the semiconductor substrate;
   a p-type collector region located in a second part of the front surface of the semiconductor substrate;
   an n-type base region located between the emitter region and the collector region in a third part of the front surface of the semiconductor substrate;
   a p-type first embedded region located below the base region; and
   an n-type region having a lower n-type impurity concentration than the base region, being in contact with the emitter region, the collector region, the base region and the first embedded region, separating the emitter region from the base region and the first embedded region, and separating the collector region from the base region and the first embedded region, wherein the base region comprises:
a first base region positioned above the first embedded region; and
a second base region positioned on a collector region side more than the first base region, and
the second base region has a higher n-type impurity concentration than the first base region.

2. The bipolar transistor as in claim 1, wherein the semiconductor substrate further comprises a stopping region having a higher n-type impurity concentration than the n-type region, partially being in contact with the first embedded region from the collector region side, and being separated from the emitter region and the collector region by the n-type region.

3. The bipolar transistor as in claim 1, wherein the semiconductor substrate further comprises a p-type second embedded region located below the first embedded region and separated from the emitter region, the collector region and the first embedded region by the n-type region.

4. A bipolar transistor comprising a semiconductor substrate,
wherein the semiconductor substrate comprises:
an n-type emitter region located in a first part of a front surface of the semiconductor substrate;
an n-type collector region located in a second part of the front surface of the semiconductor substrate;
a p-type base region located between the emitter region and the collector region in a third part of the front surface of the semiconductor substrate;
an n-type first embedded region located below the base region; and
a p-type region having a lower p-type impurity concentration than the base region, being in contact with the emitter region, the collector region, the base region and the first embedded region, separating the emitter region from the base region and the first embedded region, and separating the collector region from the base region and the first embedded region,
wherein the base region comprises:
a first base region positioned above the first embedded region; and
a second base region positioned on an emitter region side more than the first base region, and
the second base region has a higher p-type impurity concentration than the first base region.

5. The bipolar transistor as in claim 4, wherein the semiconductor substrate further comprises a stopping region having a higher p-type impurity concentration than the p-type region, partially being in contact with the first embedded region from the emitter region side, and being separated from the emitter region and the collector region by the p-type region.

6. The bipolar transistor as in claim 4, wherein the semiconductor substrate further comprises an n-type second embedded region located below the first embedded region, and separated from the emitter region, the collector region and the first embedded region by the p-type region.

\* \* \* \* \*